United States Patent
Specht et al.

(10) Patent No.: US 7,411,822 B2
(45) Date of Patent: Aug. 12, 2008

(54) NONVOLATILE MEMORY CELL ARRANGEMENT

(75) Inventors: Michael Specht, München (DE); Franz Hofmann, München (DE); Ulrich Dorda, Wien (AT); Johannes Kretz, Dresden (DE); Lars Dreeskornfeld, Dresden (DE)

(73) Assignee: Infineon Technologies AG, Munich (DE)

( * ) Notice: Subject to any disclaimer, the term of this patent is extended or adjusted under 35 U.S.C. 154(b) by 4 days.

(21) Appl. No.: 11/283,572

(22) Filed: Nov. 18, 2005

(65) Prior Publication Data

US 2006/0181925 A1 Aug. 17, 2006

(30) Foreign Application Priority Data

Nov. 19, 2004 (DE) ................ 10 2004 055 929

(51) Int. Cl.
*G11C 11/34* (2006.01)
*G11C 5/06* (2006.01)
*H01L 27/10* (2006.01)
*H01L 29/76* (2006.01)
*H01L 29/40* (2006.01)

(52) U.S. Cl. .............. 365/185.05; 365/63; 257/211; 257/381; 257/758

(58) Field of Classification Search ........... 257/211, 257/381, 758; 365/185.05, 63
See application file for complete search history.

(56) References Cited

U.S. PATENT DOCUMENTS

| | | | |
|---|---|---|---|
| 6,421,267 B1 * | 7/2002 | Kuo et al. ............... 365/63 |
| 6,617,632 B2 * | 9/2003 | Taniguchi et al. ........ 257/296 |
| 2002/0036927 A1 * | 3/2002 | Mori et al. ............ 365/185.33 |
| 2003/0123272 A1 * | 7/2003 | Kang et al. ............... 365/63 |
| 2004/0090851 A1 * | 5/2004 | Tanzawa et al. ........... 365/200 |
| 2004/0115883 A1 * | 6/2004 | Iwata et al. ............... 438/257 |
| 2004/0136222 A1 * | 7/2004 | Ostermayr ............... 365/104 |
| 2004/0212008 A1 * | 10/2004 | Hasegawa ............... 257/316 |
| 2005/0121793 A1 * | 6/2005 | Liaw ...................... 257/758 |
| 2005/0199913 A1 * | 9/2005 | Hofmann et al. ......... 257/204 |
| 2005/0280001 A1 * | 12/2005 | Chang ..................... 257/68 |
| 2006/0083077 A1 * | 4/2006 | Mirichigni et al. ..... 365/189.06 |

FOREIGN PATENT DOCUMENTS

DE 102 41 171 2/2004

OTHER PUBLICATIONS

Cho, E.S. et al., "Optimized Cell Structure for FinFET Array Flash Memory," IEEE, pp. 289-292 (2004).

Fujiwara, I. "0.13 μm MONOS Single Transistor Memory Cell with Separated Source Lines," IEEE, pp. 4 (1998).

* cited by examiner

*Primary Examiner*—Ly D Pham
(74) *Attorney, Agent, or Firm*—Dicke, Billig & Czaja, PLLC

(57) ABSTRACT

Memory transistors are arranged in a plurality of rows and columns. A first source/drain terminal of each memory transistor of a first column is connected to an electrically conductive conductor track in a first metallization plane, and a first source/drain terminal of each memory transistor of a second column adjacent to the first column is connected to an electrically conductive conductor track in a second metallization plane.

19 Claims, 7 Drawing Sheets

NONVOLATILE MEMORY CELL ARRANGEMENT

CROSS-REFERENCE TO RELATED APPLICATIONS

This Utility Patent Application claims priority to German Patent Application No. DE 10 2004 055 929.5, filed on Nov. 19, 2004, which is incorporated herein by reference.

BACKGROUND

The invention relates to a nonvolatile memory cell arrangement.

In modern semiconductor technology various approaches are being pursued in order to improve the performance and the storage capacities of memory cell arrangements. These approaches consist not only in the development of novel types of transistors, but also in a continued scaling and miniaturization of the field effect transistors and in novel memory cell architectures.

One such type of transistor is a fin field effect transistor (FinFET), for example, in which the channel region between two source/drain regions is realized as a semiconductor fin, above which a gate region is deposited. The storage capacity of a memory cell arrangement is improved with a fin field effect transistor on account of the small space requirement for realizing the latter.

For high-density nonvolatile data storage, floating gate based NAND memory architectures are commercially predominant at the present time. Advantages of a NAND memory arrangement include the low costs per memory bit, in particular for so-called multilevel storage, the simple fabrication process and also a good scalability of the memory cells for F>50 nm, where F denotes the side length of the memory cell array and is essentially determined by the technology.

FIG. 1 illustrates a memory cell arrangement 100 in NAND circuitry interconnection. The NAND memory cell arrangement 100 has a plurality of memory cells 109 each having a memory transistor 102. Each memory transistor 102 has a storage layer 103 in which electrical charge carriers can be stored in nonvolatile fashion. Furthermore, the NAND memory cell arrangement 100 is provided with a first control transistor 101, a second control transistor 104 and also a plurality of gate terminal connecting lines 105 (also referred to as word lines) arranged in parallel, a source terminal connecting line 106, a supply line 107 and a contact location 108 on the supply line 107. The memory transistors 102 are connected in series with one another by means of their source/drain terminal and are arranged between the first control transistor 101 and the second control transistor 104. The first control transistor 101 is electrically connected by its drain terminal to the supply line 107 by means of the contact location 108 and by its source terminal to the drain terminal of a first memory transistor 102 of the plurality of memory transistors 102. The source terminal of a respective memory transistor 102 is connected to a respective drain terminal of the respectively adjacent memory transistor 102. The second control transistor 104 is connected by its source terminal to the source line 106. The control transistors 101, 104 and the memory transistors 102 are in each case connected by their gate terminal to a respective gate terminal connecting line 105.

E. S. Cho, T. Y. Kim, C. Lee, Optimized Cell Structure for FinFet Array Flash Memory, 34th European Solid-State Device Research Conference, 2004, pages 289-292 discloses a NOR memory arrangement in which the memory transistors are constructed as floating gate fin field effect transistors. In the case of the floating gate fin field effect transistor described in E. S. Cho, T. Y. Kim, C. Lee, Optimized Cell Structure for FinFet Array Flash Memory, 34th European Solid-State Device Research Conference, 2004, pages 289-292, an ONO layer sequence (silicon dioxide/silicon nitride/silicon dioxide) is provided for the electrical insulation of the floating gate made of polysilicon.

However, considerable difficulties are to be expected for F<50 nm on account of increasing capacitive floating gate-to-floating gate interactions or couplings, and also an impaired gate controllability of the floating gate and a punch-through effect as a result of a read drain voltage or low read currents.

Furthermore, I. Fujiwara et al, 0.13 µm MONOS single transistor memory cells with separated source lines, IEEE, International Electron Device Meeting, Technical Digest, 1998 describes a MONOS $6F^2$ memory cell arrangement having source lines that are referred to therein as "winding source lines".

US 2002/0036927 A1 describes a memory cell arrangement in matrix form in which the source lines are arranged in one plane and the bit lines run perpendicular to the source lines and are arranged in a different plane than the source lines.

DE 102 41 171 A1 describes a word and bit line arrangement for a FINFET semiconductor memory. The bit lines are connected to a multiplicity of contact regions and run diagonally with respect to the columns of the transistors. The longitudinal axes of first bit line segments run parallel to a first bit line direction and the longitudinal axes of second bit line segments run parallel to a second bit line direction, the second bit line direction being rotated relative to the first bit line direction.

U.S. Pat. No. 6,617,632 B2 likewise describes a memory cell arrangement whose memory cells are arranged in matrix form. In order to prevent the punch-through effect, the source and drain regions of the memory transistors are in each case surrounded by punch-through-stop layers.

SUMMARY

One embodiment of the invention provides a nonvolatile memory cell arrangement having a reduced space requirement by comparison with the prior art.

A nonvolatile memory cell arrangement has a multiplicity of nonvolatile memory cells, each nonvolatile memory cell being formed by a memory transistor in which electrical charge carriers can be stored in nonvolatile fashion. The memory transistors are arranged in a matrix having a plurality, in one case a multiplicity, of rows and columns. A first source/drain terminal of each memory transistor of a first column is connected to an electrically conductive conductor track in a first metallization plane of the memory cell arrangement. A first source/drain terminal of each memory transistor of a second column adjacent, preferably directly adjacent, to the first column is connected to an electrically conductive conductor track in a second metallization plane, the second metallization plane being different than the first metallization plane.

To put it another way, this means that the first source/drain terminals of the memory transistors of the first column are coupled to conductor tracks of a different metallization plane than the first source/drain terminals of the memory transistors of the second column.

In this way, the invention clearly makes it possible to arrange the memory transistors of adjacent columns in a memory arrangement closer to one another. Particularly in the case of a NOR memory arrangement, it is necessary for the first source/drain terminals of memory transistors of adjacent columns to be driven separately. According to one embodiment of the invention, an electrical insulation and thus separate drivability of the first source/drain terminal of memory transistors of adjacent columns are ensured and the memory transistors of adjacent columns are nevertheless arranged very close together in the circuit layout. This is made possible in particular by means of the coupling and driving of the first source/drain terminal of memory transistors of adjacent columns to and by means of conductor tracks (source lines) in different metallization planes.

One embodiment of the invention provides a novel memory cell architecture by means of which, some of the disadvantages described above can be minimized. The difficulties in accordance with the prior art are attained in particular by means of a miniaturization of the structures of the memory cell arrangement and a NOR circuitry interconnection of the memory transistors of the nonvolatile memory cells.

In the case of a nonvolatile memory cell arrangement having a multiplicity of rows and columns in a memory matrix, a multiplicity of memory transistors being provided in each row and in each column, the electrically conductive conductor tracks of the first source/drain terminals of adjacent memory transistors (that is to say of memory transistors in adjacent columns) are arranged alternately in different metallization planes, that is to say are arranged alternately in a first metallization plane and a second metallization plane, respectively. Thus, by way of example, the conductor tracks for the memory transistors of a first column are arranged in a first metallization plane, the conductor tracks for the memory transistors of a second column are arranged in a second metallization plane, the conductor tracks for the memory transistors of a third column are arranged in the first metallization plane, the conductor tracks for the memory transistors of a fourth column are arranged in the second metallization plane, the conductor tracks for the memory transistors of a fifth column are arranged in the first metallization plane, etc.

In one case, the memory transistors are connected up to one another in a NOR circuit. This type of circuitry interconnection enables a highly space-saving arrangement and coupling of the memory transistors and also of the conductor tracks, in which case it continues to be ensured that the first source/drain terminals of the memory transistors of adjacent columns can be electrically driven independently of one another.

In one refinement of the invention, the memory transistors are fin field effect transistors.

Even if the second source/drain terminals of the memory transistors from different columns can be coupled to conductor tracks in different metallization planes, it is provided, in one development of the invention, for the conductor tracks which are coupled to the second source/drain terminals of the memory transistors, and which are also referred to as bit lines, to be arranged in a common metallization plane, in a third metallization plane, the third metallization plane being different than the first metallization plane and different than the second metallization plane.

An additional space saving is achieved for the memory arrangement in this way.

In accordance with another refinement of the invention, it is provided that a gate terminal of each memory transistor is connected to a respective electrically conductive conductor track in a fourth metallization plane, the fourth metallization plane being different than the first metallization plane, different than the second metallization plane and different than the third metallization plane.

In one case, the memory transistors each have an ONO charge storage layer in which the electrical charge carriers can be stored in nonvolatile fashion for storing the respective bit.

As an alternative, the memory transistors may each have a floating gate charge storage layer in which the electrical charge carriers can be stored in nonvolatile fashion.

In one case, the memory transistors are silicon memory transistors.

One refinement of the invention is to be seen in the configuration of the memory transistors as SONOS fin field effect transistors; that is to say that in this case the memory transistors are silicon based fin field effect transistors having an ONO layer sequence (silicon dioxide/silicon nitride/silicon dioxide layer sequence) as charge storage layer for the nonvolatile storage of the electrical charge carriers.

In comparison with floating gate cells (floating gate memory transistors), FinFET SONOS trapping layer cells (SONOS fin field effect transistors) afford the advantage of better scalability of the memory transistor and improved electrostatic shielding of the memory cells from one another on account of the memory cell architecture.

Since, however, in the case of a NAND memory cell arrangement in the case of FinFET for a multilevel application charge losses of non-addressed memory cells occur as a result of write and read disturb, the above-described refinement of the memory transistors as SONOS fin field effect transistors is used when the SONOS fin field effect transistors are connected up in a NOR circuit arrangement.

At least one portion of the memory transistors, and in one case all of the memory transistors, are in each case formed in a $6F^2$ basic area or in a $4F^2$ basic area in the nonvolatile memory cell arrangement.

This very compact arrangement of the memory transistors and of the memory cells within the nonvolatile memory cell arrangement is made possible in particular by the use of SONOS fin field effect transistors as memory transistors and the interconnection thereof in NOR circuitry interconnection, and in this case in particular by the use of bulk fin field effect transistors, one case of bulk SONOS fin field effect transistors, as memory transistors, which are electrically insulated from one another by means of shallow trench isolation (STI) in the memory cell arrangement.

The second metallization plane is arranged above, and in one case directly above the first metallization plane.

The third metallization plane is arranged above, and in one case directly above the second metallization plane.

The fourth metallization plane is arranged above, and in one case directly above the third metallization plane.

The first metallization plane is the metallization plane 1 of the nonvolatile memory cell arrangement, to put it another way the first metallization plane arranged directly above the memory transistors from the point of view of the substrate.

In one embodiment, the second metallization plane is the metallization plane 2 of the nonvolatile memory cell arrangement, the third metallization plane is the metallization plane 3 of the nonvolatile memory cell arrangement, and the fourth metallization plane is the metallization plane 4 of the nonvolatile memory cell arrangement.

However, it should be noted in this context that the metallization planes need not in each case be metallization planes that are arranged directly above one another, rather it is also possible, as required, to provide one or more additional metallization planes between the abovementioned metallization planes.

Clearly, a $4F^2$ NOR memory cell architecture having nonvolatile FinFET memory cells or a $6F^2$ NOR memory cell architecture having nonvolatile FinFET memory cells is thus proposed. A NOR memory cell architecture applied to FinFET-SONOS has a better capability to withstand a disturb in comparison with the NAND memory cell architectures and better shielding of the trapping layer-to-trapping layer interaction of adjacent nonvolatile memory cells, a trapping layer being a storage layer (in one case ONO layer sequence) of a memory transistor. The improved shielding is essentially achieved by means of the arrangement of the bit line contacts between adjacent memory cells. Furthermore, the read currents are significantly higher by a factor of typically 100 in comparison with the read currents of NAND memory architectures. This can be attributed to the fact that, in contrast to the serial read-out of the memory cells of NAND memory cell architectures, in NOR memory cell architectures each memory cell is connected to metal lines, thereby enabling each memory cell to be read separately.

Furthermore, a tri-gate architecture of the memory transistors results in a better scalability of the gate length of the memory transistors in comparison with floating gate architectures of the memory transistors in NAND memory cell architectures.

In one case, the invention can be seen in a triple metal layer architecture in which the source lines and bit lines are laid one on top of the other, to put it another way are arranged one above the other, in such a way that a $4F^2$ density or a $6F^2$ density is provided.

In one case, the source line for making contact with source terminals of memory transistors of a first column is arranged in a first metallization plane, in particular the metallization plane 1, the source line for making contact with source terminals of memory transistors of a second column adjacent to the first column is arranged in a second metallization plane (which is different relative to the first metallization plane), in particular the metallization plane 2, and the bit lines of all memory transistors for making contact with the respective drain terminals of the memory transistors are arranged in a third metallization plane (which is different relative to the first metallization plane and the second metallization plane), in particular the metallization plane 3. The source line for making contact with source terminals of, preferably all, memory transistors of a third column arranged adjacent to the second column is once again arranged in the first metallization plane and the source line for making contact with source terminals of memory transistors of a fourth column arranged adjacent to the third column is arranged in the second metallization plane. Consequently, a recurring arrangement is clearly produced in the direction perpendicular to the columns in accordance with the following specification:

source line for making contact with source terminals of memory transistors of an (n)-th column in the first metallization plane;

bit line for making contact with drain terminals of memory transistors of the (n-th) column in the third metallization plane;

source line for making contact with source terminals of memory transistors of an (n+1)-th column in the second metallization plane;

bit line for making contact with drain terminals of memory transistors of the (n+1)-th column in the third metallization plane;

source line for making contact with source terminals of memory transistors of an (n+2)-th column in the first metallization plane;

bit line for making contact with drain terminals of memory transistors of the (n+2)-th column in the third metallization plane;

source line for making contact with source terminals of memory transistors of an (n+3)-th column in the second metallization plane;

bit line for making contact with drain terminals of memory transistors of the (n+3)-th column in the third metallization plane; etc.

In this case, n is a natural number between 1 and N-3, where N specifies the number of columns in the memory cell arrangement.

In an embodiment which is provided in addition or as an alternative to the embodiments illustrated above, a nonvolatile memory cell arrangement is provided, having a multiplicity of nonvolatile memory cells, each nonvolatile memory cell being formed by a memory transistor in which electrical charge carriers can be stored in nonvolatile fashion, the memory transistors being arranged in a matrix having a plurality of rows and columns, a first source/drain terminal of each memory transistor of a first column being connected to an electrically conductive conductor track in a first metallization plane, and a first source/drain terminal of each memory transistor of a second column adjacent to the first column being connected to an electrically conductive conductor track in a second metallization plane, the conductor tracks being arranged in the column direction alongside the source/drain terminals and having, alongside a portion of the source/drain terminals of the memory transistors of a column, in each case a projection extending perpendicularly to the column direction as far as above the respective source/drain terminal, the conductor tracks being coupled to the respective source/drain terminal by means of a respective projection and by means of a contact hole respectively provided below the latter.

It should be noted that the above refinements of the first embodiment also hold true for the nonvolatile memory cell arrangement in accordance with the above second embodiment.

One development of the invention provides for the conductor tracks which are coupled to the second source/drain terminals of the memory transistors, and which are also referred to as bit lines, to be arranged in a common metallization plane, particularly preferably in a third metallization plane, the third metallization plane being different than the first metallization plane and different than the second metallization plane.

In accordance with this nonvolatile memory cell arrangement, it is preferably provided that the first metallization plane is identical to the second metallization plane.

The conductor tracks of mutually adjacent columns may be arranged such that the edge of the adjacent conductor track which is inclined toward the projection directly adjoins the edge of the projection which is directed away from the conductor track (in which case the first metallization plane is different than the second metallization plane). As an alternative, a sufficiently large distance, preferably a distance of F (F is the maximum resolution of the technology respectively used), may be provided between the edge of the adjacent conductor track which is inclined toward the projection and the edge of the projection which is directed away from the conductor track. In this case, the first metallization plane may also be identical to the second metallization plane.

Preferably, the column direction, that is to say the direction parallel to the source lines and the bit lines, is identical to the longitudinal extent of the fins of the fin field effect transistors.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
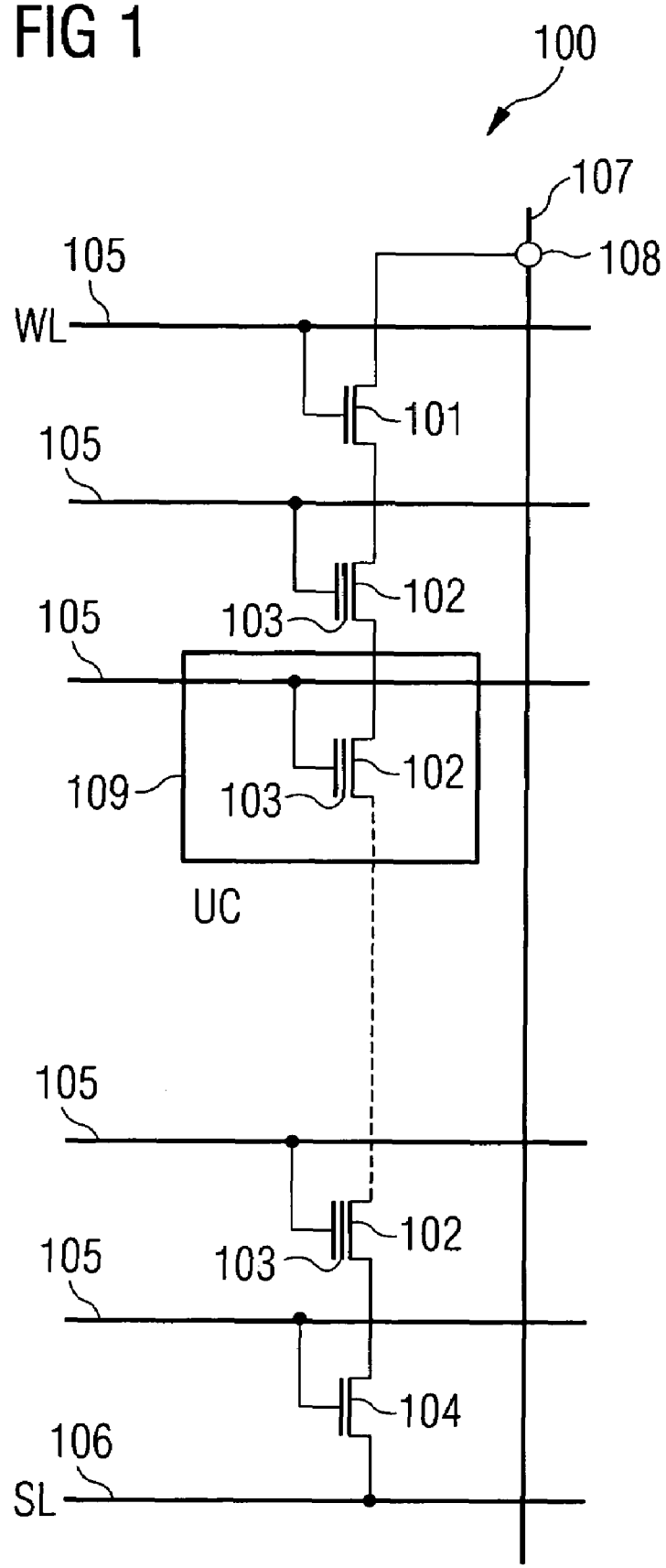
FIG. 1 illustrates a memory cell arrangement with a NAND circuitry interconnection of the memory transistors.
Figure 2:
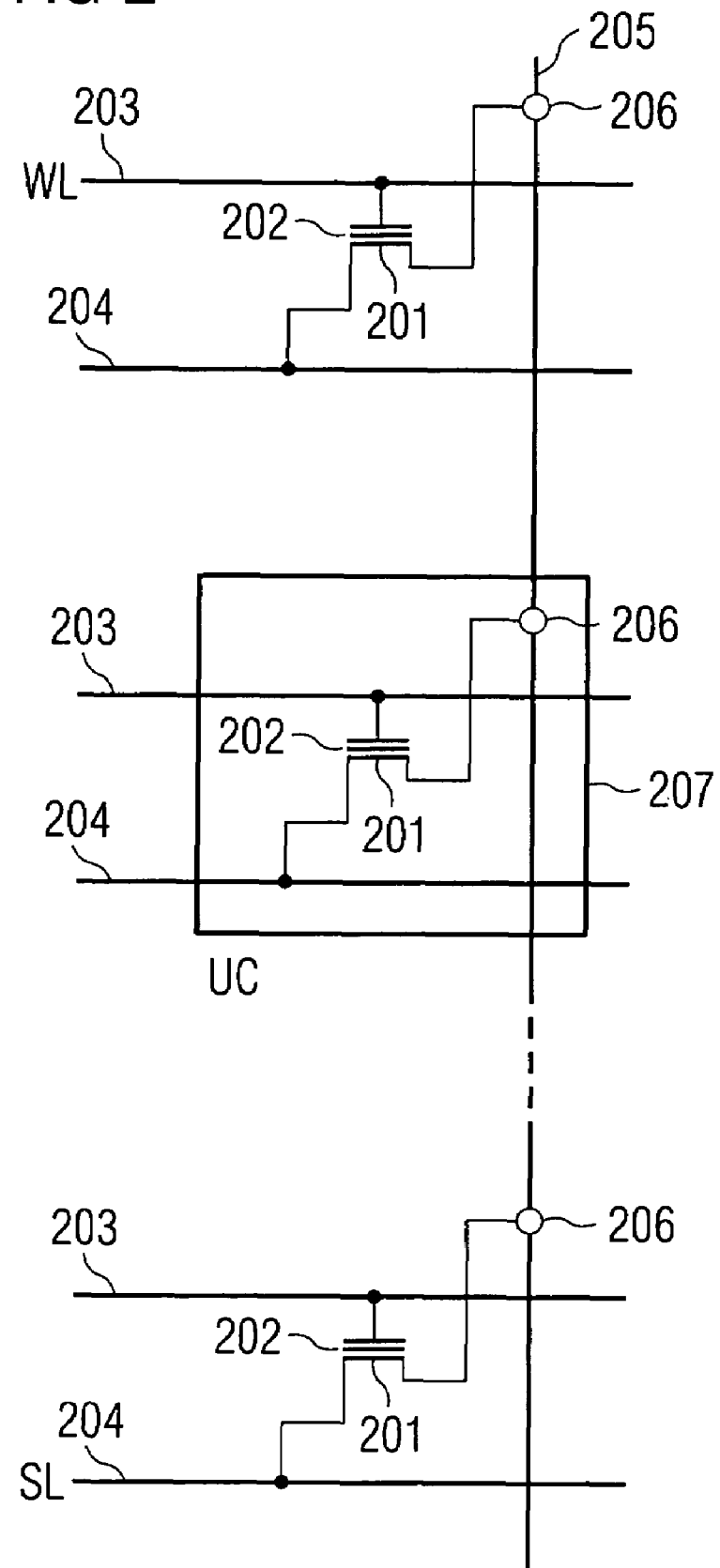
FIG. 2 illustrates a memory cell arrangement in accordance with one exemplary embodiment of the invention with a NOR circuitry interconnection of the memory transistors.

FIG. 2 illustrates a circuit-technological illustration of a memory cell arrangement 200 in NOR circuitry interconnection in accordance with one exemplary embodiment of the invention.

The memory cell arrangement 200 has a plurality of memory transistors 201, each having a charge storage layer 202, a plurality of gate terminal connecting lines 203, a plurality of source terminal connecting lines 204, a supply line 205 and a plurality of contact locations 206, a memory cell 207 in each case being formed from one memory transistor 201.

Each memory transistor 201 is in each case electrically connected by the gate terminal to a gate terminal connecting line 203 and by the source terminal to a source terminal connecting line 204. The drain terminal of each memory transistor 201 is in each case electrically connected to the supply line 205 by means of the contact location 206.

By means of the NOR circuitry interconnection of the memory transistors 201 of the memory cell arrangement 200 that is formed in this way, it is possible to significantly reduce the coupling capacitances between adjacent conductor tracks of a metallization plane since each memory transistor 201 of a nonvolatile memory cell 207 of the memory cell arrangement 200 can be driven individually. By the use of a NOR circuitry interconnection of the memory transistors 201 in the memory cell arrangement 200 in accordance with these exemplary embodiments of the invention, it is possible to significantly improve the response time and read time in the case of the memory cell arrangement 200 by comparison with the prior art.

The drive circuits for writing and reading the memory information, which are likewise provided in the memory cell arrangement 200, are not illustrated in the figures for reasons of simpler illustration of the invention. Furthermore, for reasons of simpler illustration, FIG. 2 illustrates only one row of the memory cell arrangement 200, which has a multiplicity of rows and columns, each column and each row in each case being provided with a multiplicity of memory cells 207 and memory transistors 201 which form the latter and which are coupled to one another in NOR circuitry interconnection.

Figure 3:
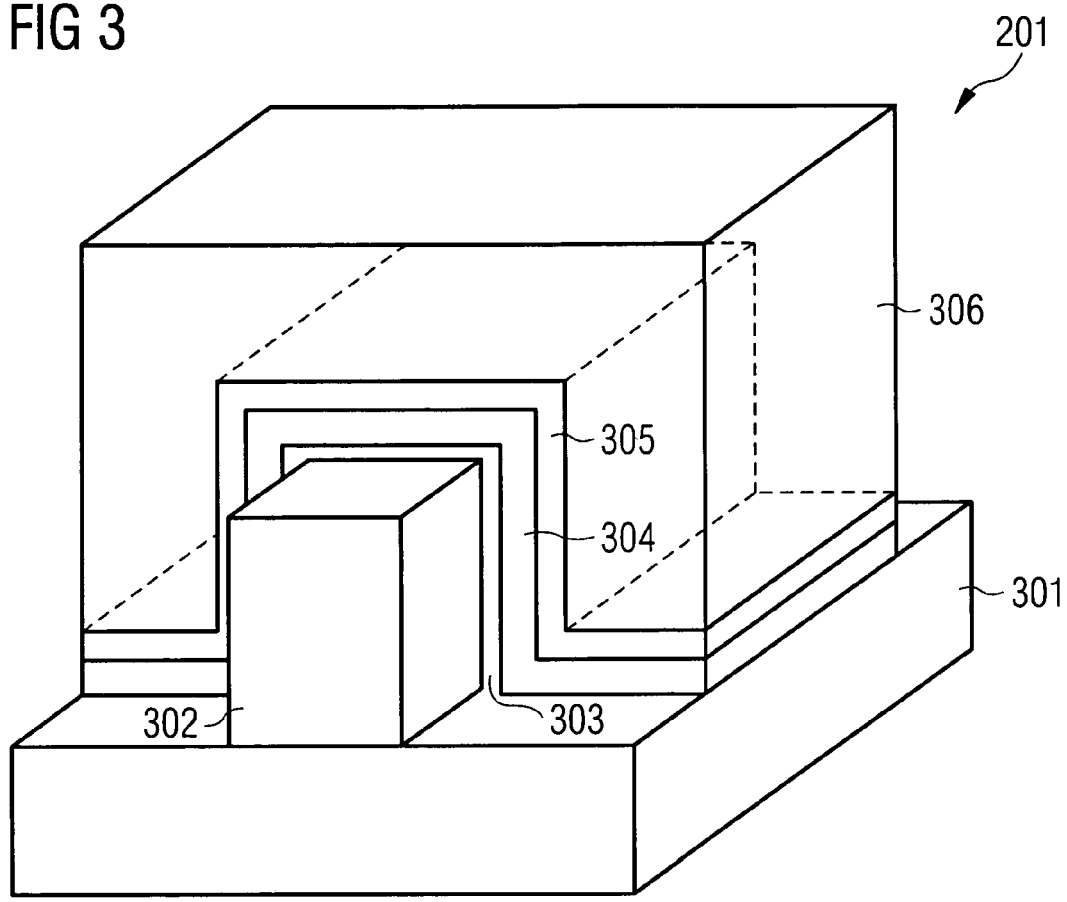
FIG. 3 illustrates a SONOS field effect transistor as a memory transistor in accordance with one exemplary embodiment of the invention.

FIG. 3 illustrates a memory transistor 201 of the memory cell arrangement 200 in detail.

In accordance with these exemplary embodiments of the invention, the memory transistors 201 are configured as SONOS fin field effect transistors (silicon/silicon dioxide/silicon nitride/silicon dioxide/silicon fin field effect transistors), in particular as SONOS fin field effect transistors with a substrate terminal (bulk silicon/silicon dioxide/silicon nitride/silicon dioxide/silicon fin field effect transistors) which are electrically insulated from one another in the memory cell arrangement 200 by means of so-called shallow trench isolation (STI).

The memory transistor 201 has a silicon dioxide layer 301 buried in a substrate (not illustrated), an integrated silicon fin 302 applied on the silicon dioxide layer 301, which fin has a first source/drain region, a channel region and a second source/drain region. On the channel region, an ONO layer sequence as charge storage layer sequence is applied along the sidewalls of the silicon fin 302 and on the upper surface of the silicon fin 302. The ONO layer sequence has a first silicon oxide layer 303, a silicon nitride layer 304 formed on the first silicon oxide layer 303, a second silicon oxide layer 305 formed on the silicon nitride layer 304. A polysilicon layer 306 forming the word line and the gate terminal of the memory transistor 201 is applied on the second silicon oxide layer 305.

The silicon fin 302 has a width of approximately 10 nm and a height of approximately 20 nm.

The source region and the drain region are arranged in the silicon fin 302, in a manner adjoining the channel region, which is situated below the gate region likewise in the silicon fin 302. In the memory transistor 201, two bits can be stored in the ONO layer sequence by the application of suitable electrical potentials to its terminals.

By means of a suitable gate-source voltage, it is possible to store, in the ONO layer sequence in a region between gate and source, a first bit in the form of electrical charge carriers that are introduced into or erased from this region. Furthermore, by means of a suitable gate-drain voltage, it is possible to store, in the ONO layer sequence in a region between gate and drain, a second bit in the form of electrical charge carriers that are introduced into or erased from this region.

Figure 4:
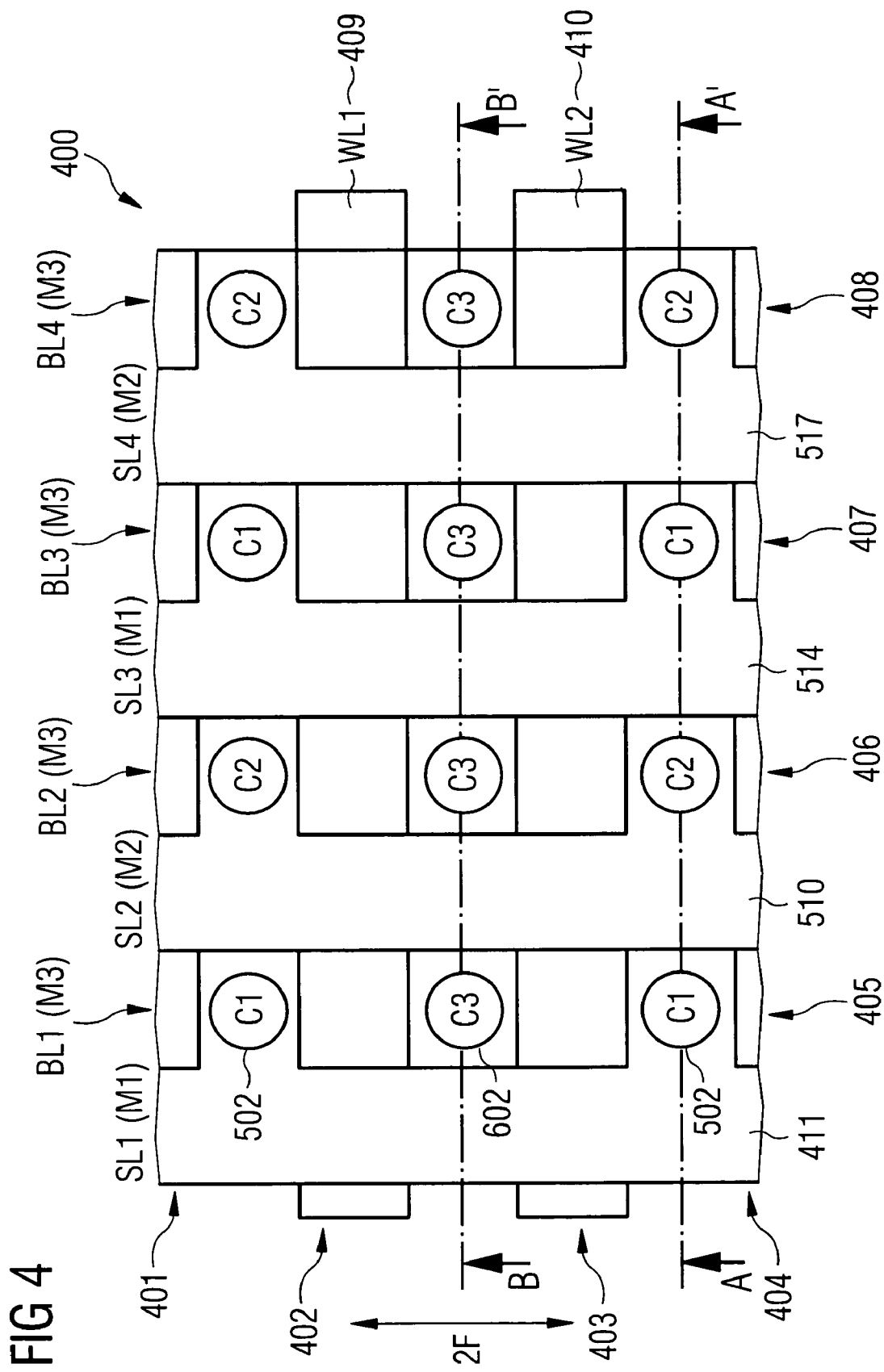
FIG. 4 illustrates a plan view of a $4F^2$ memory cell arrangement in accordance with a first exemplary embodiment of the invention.

FIG. 4 illustrates a plan view of a $4F^2$ memory cell arrangement 400 in accordance with a first exemplary embodiment of the invention, where F denotes the side length of the memory cell array and is essentially determined by the technology used.

The $4F^2$ memory cell arrangement 400 has a multiplicity of memory cells 207 which are arranged in matrix form in a multiplicity of rows 401, 402, 403, 404 and a multiplicity of columns 405, 406, 407, 408 which each have one of the SONOS fin field effect transistors 201 described above as memory transistors 201.

A multiplicity of memory cells 207 are provided in each row 401, 402, 403, 404 and in each column 405, 406, 407, 408.

The SONOS fin field effect transistors 201 are electrically coupled to one another in accordance with the NOR circuitry interconnection described above.

The SONOS fin field effect transistors 201 of a respective row 401, 402, 403, 404 are electrically coupled to a word line 409, 410 by means of their respective gate terminals and are electrically coupled to one another by means of said word line. In this way, by application of a suitable activation potential to a word line 409, 410, the SONOS fin field effect transistors 201 which are assigned to this word line 409, 410 and are coupled thereto are selected and thus activated for reading or writing stored information.

Figure 5:
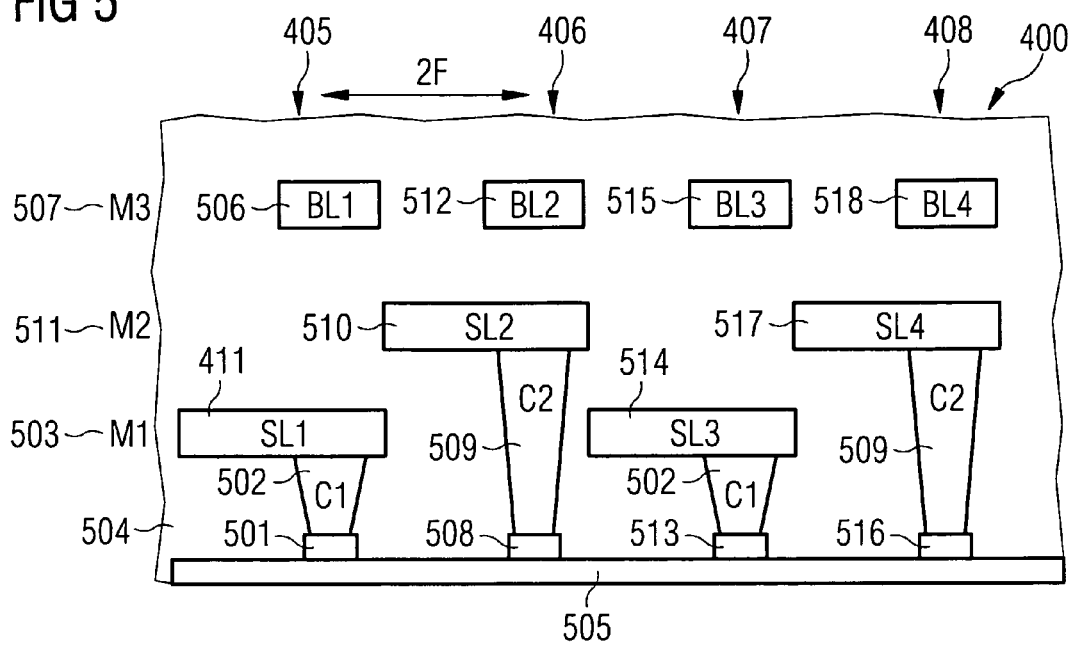
FIG. 5 illustrates a cross-sectional view of the $4F^2$ memory cell arrangement in accordance with FIG. 4 along the sectional line AA'.

FIG. 5 illustrates a sectional illustration of the $4F^2$ memory cell arrangement 400 along the sectional line AA' illustrated in FIG. 4.

As is illustrated in FIG. 4 and FIG. 5, first source/drain terminals 501 of the SONOS fin field effect transistors 201 of the first column 405 are coupled to a first source line SL1 411 by means of a respective first contact hole C1 502 (also referred to as a contact via). The first source line SL1 411 is formed in the first metallization plane M1 503 of the $4F^2$ memory cell arrangement 400. The first metallization plane M1 503 is formed directly above the circuit plane in the substrate 505 in which the SONOS fin field effect transistors 201 are formed. An intermetal dielectric 504 made of silicon oxide or any other dielectric such as, for example, a low-k dielectric (e.g. SiLK™) is provided between the SONOS fin field effect transistors 201 and the first source line SL1 411. The first contact holes C1 502 filled with a metal, for example tungsten or tantalum, are introduced into the intermetal dielectric 504, so that the first source line SL1 411 is coupled to the first source/drain terminals 401 of the SONOS fin field effect transistors 201 of the first column 405.

Figure 6:
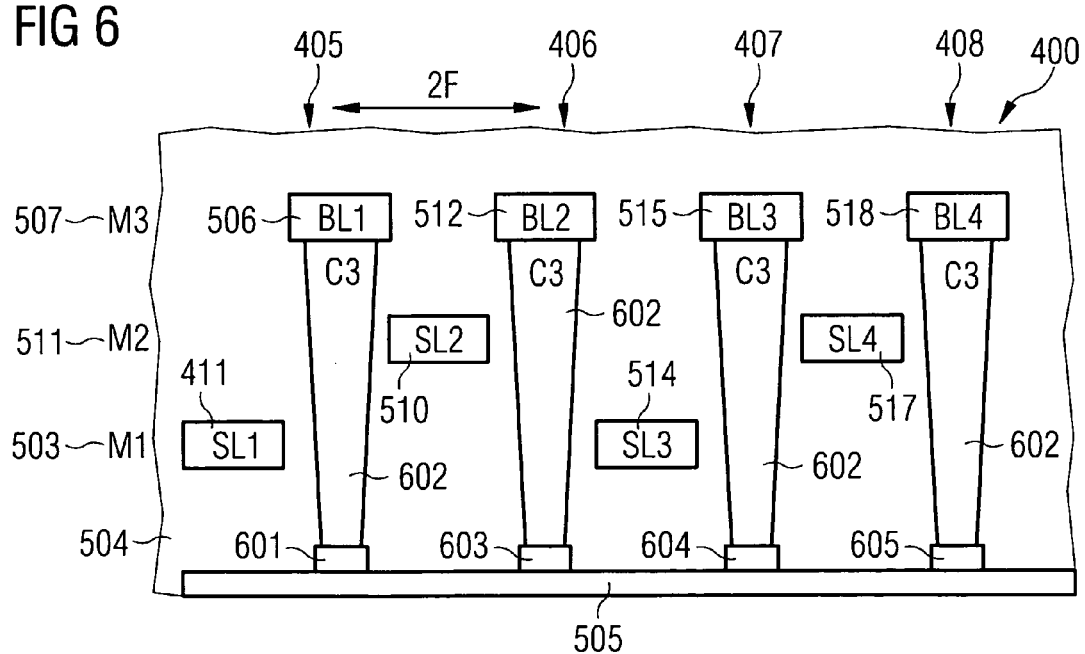
FIG. 6 illustrates a cross-sectional view of the $4F^2$ memory cell arrangement in accordance with FIG. 4 along the sectional line BB'.

FIG. 6 illustrates a sectional illustration of the $4F^2$ memory cell arrangement 400 along the sectional line BB' illustrated in FIG. 4.

As is illustrated in FIG. 4 and FIG. 6, second source/drain terminals 601 of the SONOS fin field effect transistors 201 of the first column 405 are coupled to a first bit line BL1 506 by means of a respective second contact hole C3 602. The first bit line BL1 506 is formed in the third metallization plane M3 507 of the $4F^2$ memory cell arrangement 400. An intermetal dielectric 504 made of silicon oxide or any other dielectric such as, for example, a low-k dielectric (e.g. Silk™) is likewise provided between the SONOS fin field effect transistors 201 and the first bit line BL1 506. The second contact holes C3 602 filled with a metal, for example tungsten or tantalum, are introduced into the intermetal dielectric 504, so that the first bit line BL1 506 is coupled to the second source/drain terminals 601 of the SONOS fin field effect transistors 201 of the first column 405.

In accordance with this exemplary embodiment, in each case the two second source/drain terminals 601 of the mutually directly adjacent SONOS field effect transistors 201 of the first column 405 are coupled to one another and, by means of the respective second contact hole C3 602, to the first bit line BL1 506.

Referring to FIG. 4 and FIG. 5 again, first source/drain terminals 508 of the SONOS fin field effect transistors 201 of the second column 406 are coupled to a second source line SL2 510 by means of a respective third contact hole C2 509. The second source line SL2 510 is formed in the second metallization plane M2 511 of the $4F^2$ memory cell arrangement 400. The second metallization plane M2 511 is formed directly above the first metallization plane M1 503, but is electrically insulated from the first source line SL1 411 and the SONOS fin field effect transistors 201 by means of the intermetal dielectric 504. The third contact holes C2 509 filled with a metal, for example tungsten or tantalum, are introduced into the intermetal dielectric 504, so that the second source line SL2 510 is coupled to the first source/drain terminals 508 of the SONOS fin field effect transistors 201 of the second column 406.

As can be gathered from FIG. 4, FIG. 5 and FIG. 6, the right-hand edge region of the first source line SL1 411 in FIG. 4, the first contact holes C1 502 being situated in said edge region, extends, considered in the horizontal direction (that is to say parallel to the main processing plane of the $4F^2$ memory cell arrangement 400), as far as the left-hand edge region of the second source line SL2 510 and may even partly overlap this edge region in the horizontal direction. Since the first source line SL1 411 and the second source line SL2 510 are arranged in different metallization planes, however, and are electrically insulated from one another by means of the intermetal dielectric 504, despite this spatial proximity in the horizontal, no short circuit and hardly any coupling capacitance can occur between the first source line SL1 411 and the second source line SL2 510.

As is illustrated in FIG. 4 and FIG. 6, second source/drain terminals 603 of the SONOS fin field effect transistors 201 of the second column 406 are coupled to a second bit line BL2 512 by means of a respective second contact hole C3 602. The second bit line BL2 512, like the first bit line BL1 506 as well, is formed in the third metallization plane M3 507 of the $4F^2$ memory cell arrangement 400. Intermetal dielectric 504 is likewise provided between the SONOS fin field effect transistors 201 and the second bit line BL2 512. The second contact holes C3 602 filled with a metal, for example tungsten or tantalum, are introduced into the intermetal dielectric 504, so that the second bit line BL2 512 is coupled to the second source/drain terminals 603 of the SONOS fin field effect transistors 201 of the second column 406.

In accordance with this exemplary embodiment, in each case the two second source/drain terminals 603 of the mutually directly adjacent source fin field effect transistors 201 of the second column 406 are coupled to one another and, by means of the respective second contact hole C3 602, to the second bit line BL2 512.

Referring to FIG. 4 and FIG. 5 again, first source/drain terminals 513 of the SONOS fin field effect transistors 201 of the third column 407 are coupled to a third source line SL3 514 by means of a respective first contact hole C1 502. The third source line SL3 514 is formed in the first metallization plane M1 503 of the $4F^2$ memory cell arrangement 400.

As is illustrated in FIG. 4 and FIG. 6, second source/drain terminals 604 of the SONOS fin field effect transistors 201 of the third column 407 are coupled to a third bit line BL3 515 by means of a respective second contact hole C3 602. The third bit line BL3 515 is likewise formed in the third metallization plane M3 507 of the $4F^2$ memory cell arrangement 400. An intermetal dielectric 504 is likewise provided between the SONOS fin field effect transistors 201 and the third bit line BL3 515. The second contact holes C3 602 filled with a metal, for example tungsten or tantalum, are introduced into the intermetal dielectric 504, so that the third bit line BL3 515 is coupled to the second source/drain terminals 604 of the SONOS fin field effect transistors 201 of the third column 407.

Referring to FIG. 4 and FIG. 5 again, first source/drain terminals 516 of the SONOS fin field effect transistors 201 of the fourth column 408 are coupled to a fourth source line SL4 517 by means of a respective third contact hole C2 509. The fourth source line SL4 517 is formed in the second metallization plane M2 511 of the $4F^2$ memory cell arrangement 400. The second metallization plane M2 511 is formed directly above the first metallization plane M1 503, but is electrically insulated from the first source line SL1 411 and the SONOS fin field effect transistors 201 and also the bit lines by means of the intermetal dielectric 504. The third contact holes C2 509 filled with a metal, for example tungsten or tantalum, are introduced into the intermetal dielectric 504, so that the fourth source line SL4 517 is coupled to the first source/drain terminals 516 of the SONOS fin field effect transistors 201 of the fourth column 408.

As is illustrated in FIG. 4 and FIG. 6, second source/drain terminals 605 of the SONOS fin field effect transistors 201 of the fourth column 408 are coupled to a fourth bit line BL4 518 by means of a respective second contact hole C3 602. The fourth bit line BL4 518, like the first bit line BL1 506 as well, is formed in the third metallization plane M3 507 of the $4F^2$ memory cell arrangement 400. Intermetal dielectric 504 is likewise provided between the SONOS fin field effect transistors 201 and the fourth bit line BL4 518. The second contact holes C3 602 filled with a metal, for example tungsten or tantalum, are introduced into the intermetal dielectric 504, so that the fourth bit line BL4 518 is coupled to the second source/drain terminals 603 of the SONOS fin field effect transistors 201 of the fourth column 408.

The further SONOS fin field effect transistors 201 (not illustrated) of the other rows and columns of the $4F^2$ memory cell arrangement 400 are arranged in a corresponding manner, so that in each case the mutually directly adjacent source lines are arranged in different metallization planes, in which case preferably in each case alternately one source line is arranged in the first metallization plane and a source line arranged adjacent thereto is arranged in the second metallization plane.

In accordance with these exemplary embodiments of the invention, all of the bit lines are arranged in the same, preferably the third, metallization plane M3 507.

In accordance with this exemplary embodiment, the word lines 409, 410 are arranged at a distance of 2*F from one another. The bit lines 506, 512, 515, 518 are likewise in each case arranged at a distance of 2*F from one another. This results in a memory cell size of $4*F^2$.

Figure 7:
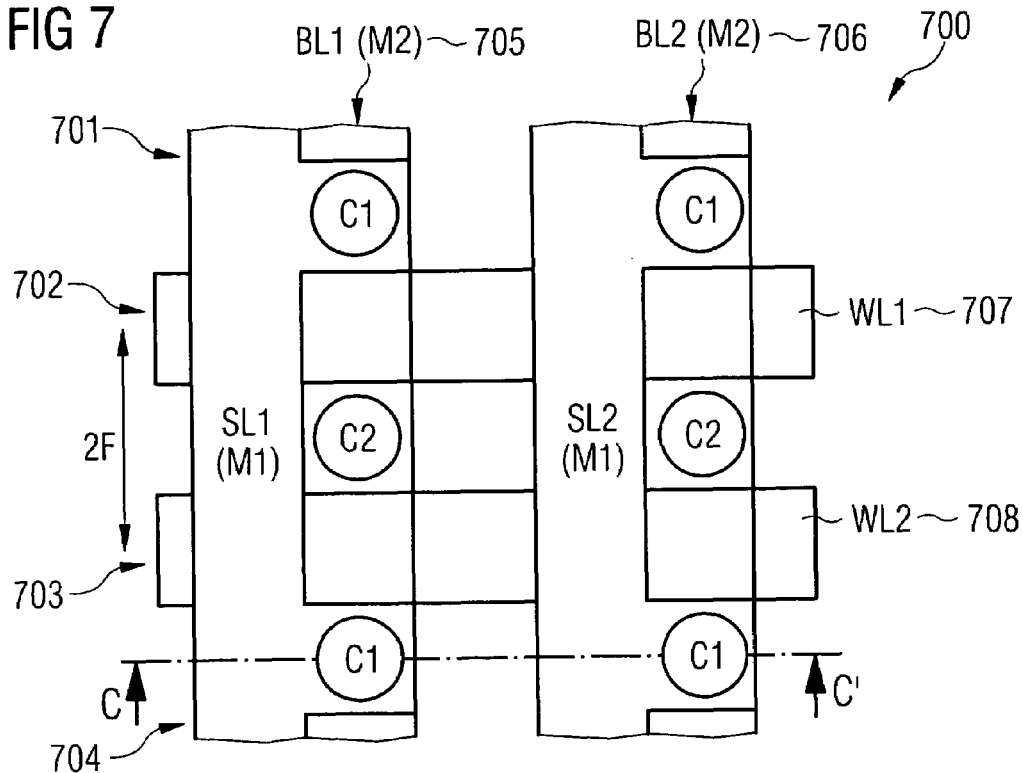
FIG. 7 illustrates a plan view of a $6F^2$ memory cell arrangement in accordance with a second exemplary embodiment of the invention.

FIG. 7 illustrates a plan view of a $6F^2$ memory cell arrangement 700 in accordance with a second exemplary embodiment of the invention.

The $6F^2$ memory cell arrangement 700 has a multiplicity of memory cells 207 which are arranged in matrix form in a multiplicity of rows 701, 702, 703, 704 and a multiplicity of columns 705, 706 and which each have one of the SONOS fin field effect transistors 201 described above as memory transistors 201.

A multiplicity of memory cells 207 are provided in each row 701, 702, 703, 704 and in each column 705, 706.

The SONOS fin field effect transistors 201 are electrically coupled to one another in accordance with the NOR circuitry interconnection described above.

The SONOS fin field effect transistors 201 of a respective row 701, 702, 703, 704 are electrically coupled to a word line 707, 708 by means of their respective gate terminals and are electrically coupled to one another by means of said word line. In this way, by application of a suitable activation potential to a word line 707, 708, the SONOS fin field effect transistors 201 which are assigned to this word line 707, 708 and are coupled thereto are selected and thus activated for reading or writing stored information.

Figure 8:
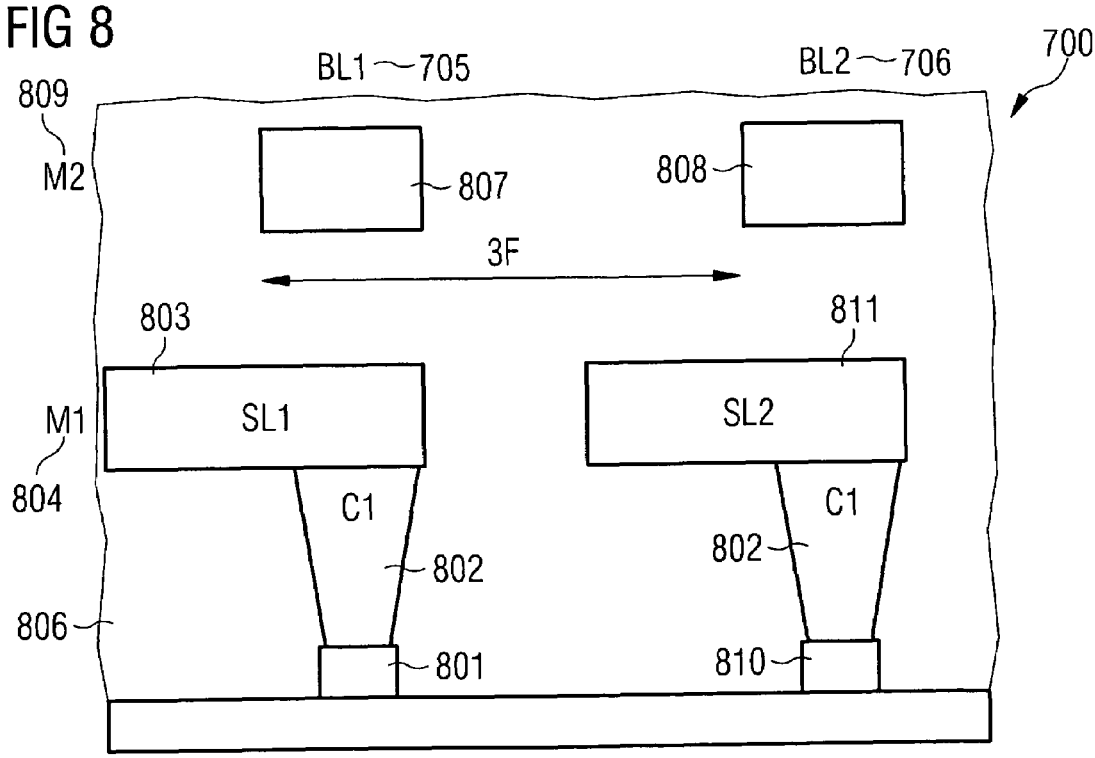
FIG. 8 illustrates a cross-sectional view of the $6F^2$ memory cell arrangement in accordance with FIG. 7 along the sectional line CC'.

FIG. 8 illustrates a sectional illustration of the $6F^2$ memory cell arrangement 700 along the sectional line CC' illustrated in FIG. 7.

As is illustrated in FIG. 7 and FIG. 8, first source/drain terminals 801 of the SONOS fin field effect transistors 201 of the first column 705 are coupled to a first source line SL1 803 by means of a respective first contact hole C1 802. The first source line SL1 803 is formed in the first metallization plane M1 804 of the $6F^2$ memory cell arrangement 700. The first metallization plane M1 804 is formed directly above the circuit plane in the substrate 805 in which the SONOS fin field effect transistors 201 are formed. An intermetal dielectric 806 made of silicon oxide or any other dielectric such as, for example, a low-k dielectric (e.g. Silk™) is provided between the SONOS fin field effect transistors 201 and the first source line SL1 803. The first contact holes C1 802 filled with a metal, for example tungsten or tantalum, are introduced into the intermetal dielectric 504, so that the first source line SL1 803 is coupled to the first source/drain terminals 801 of the SONOS fin field effect transistors 201 of the first column 705.

The connection of the second source/drain terminals to the bit lines 807, 808, which are formed in the second metallization plane M2 809, is analogous to that in accordance with the first exemplary embodiment.

First source/drain terminals 810 of the SONOS fin field effect transistors 201 of the second column 706 are coupled to a second source line SL2 811 by means of a respective first contact hole C1 802. In contrast to the first exemplary embodiment of the invention, the second source line SL2 811 is likewise formed in the first metallization plane M1 804 of the $6F^2$ memory cell arrangement 700.

A description is given below, referring to FIG. 9, of a NOR memory cell arrangement 400, 700 with the programming voltages of the NOR memory cell architectures 400, 700 in accordance with the first embodiment and in accordance with the second embodiment.

For programming the SONOS fin field effect transistor 901 of the first row 401, 701 and of the first column 405, 705, in accordance with these exemplary embodiments of the invention, an electrical voltage of 12 V is applied to the first word line 409, 707,
an electrical voltage of 4 V is applied to the second word line 410, 708,
an electrical voltage of 0 V is applied to the first source line 411, 803,
an electrical voltage of 8 V is applied to the second source line 510, 811,
an electrical voltage of 0 V is applied to the first bit line 506, 807,
an electrical voltage of 8 V is applied to the second bit line 512, 808.

Figure 9:
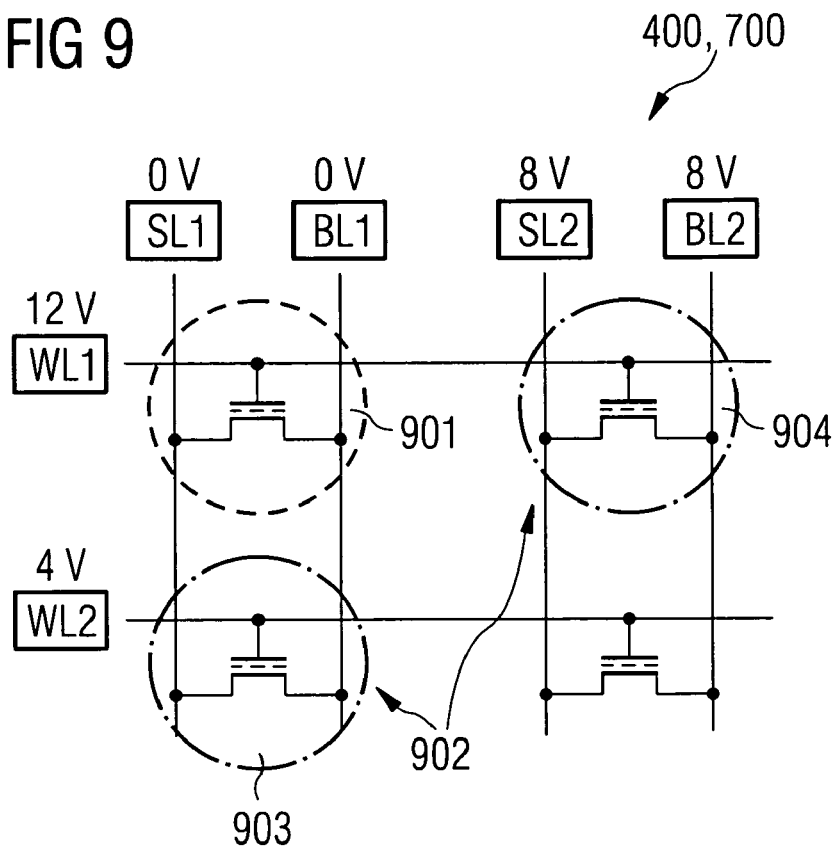
FIG. 9 illustrates a schematic illustration of the application of write voltages to the respective memory transistor terminals of the memory cell arrangement in accordance with one exemplary embodiment of the invention with a NOR circuitry interconnection of the memory transistors.

A write disturb designated by the reference symbol 902 is illustrated symbolically in FIG. 9, said write disturb affecting the SONOS fin field effect transistors 903, 904 adjacent to the SONOS fin field effect transistor 901.

A description is given below, referring to FIG. 10, of a NOR memory cell arrangement 400, 700 with the read voltages of the NOR memory cell architectures 400, 700 in accordance with the first embodiment and in accordance with the second embodiment.

For reading out the information stored in the SONOS fin field effect transistor 901 of the first row 401, 701 and of the first column 405, 705, in accordance with these exemplary embodiments of the invention, an electrical voltage of 2 V to 4.5 V is applied to the first word line 409, 707,
An electrical voltage of 0 V is applied to the second word line 410, 708,
an electrical voltage of 0 V is applied to the first source line 411, 803,
an electrical voltage of 0 V to 2 V is applied to the second source line 510, 811,
an electrical voltage of 1 V is applied to the first bit line 506, 807,
an electrical voltage of 0 V to 2 V is applied to the second bit line 512, 808.

Figure 10:
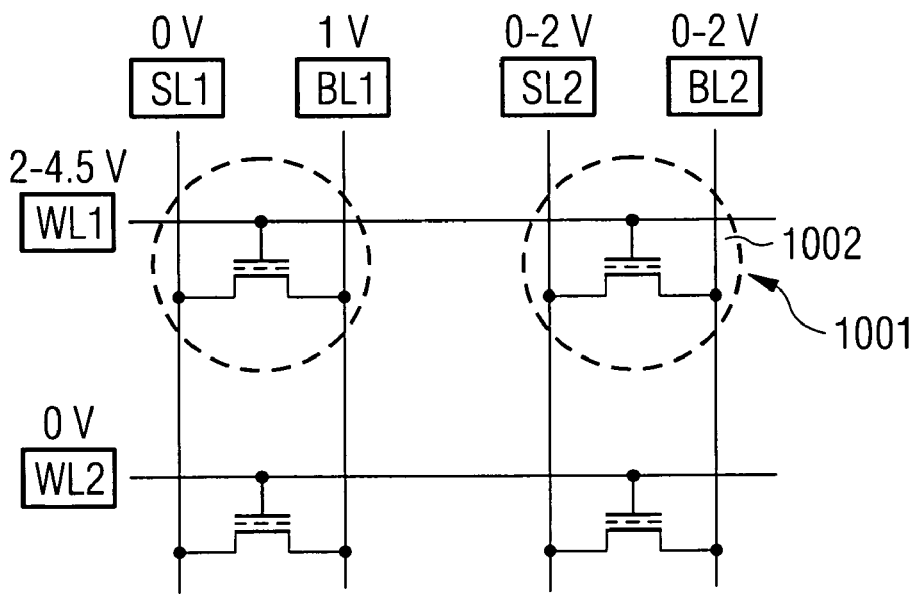
FIG. 10 illustrates a schematic illustration of the application of read voltages to the respective memory transistor terminals of the memory cell arrangement in accordance with one exemplary embodiment of the invention with a NOR circuitry interconnection of the memory transistors.

A read disturb designated by the reference symbol 1001 is illustrated symbolically in FIG. 10, said read disturb affecting the SONOS fin field effect transistor 1002 of the first row 401, 701 that is adjacent to the SONOS fin field effect transistor 901.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory, comprising:
    a multiplicity of nonvolatile memory cells, each nonvolatile memory cell being formed by a memory transistor configured so that electrical charge carriers are stored in nonvolatile fashion;
    the memory transistors are arranged in a matrix having a plurality of rows and columns;
    a first source/drain terminal of each memory transistor of a first column coupled to an electrically conductive conductor track in a first metallization plane;
    a first source/drain terminal of each memory transistor of a second column adjacent to the first column coupled to an electrically conductive conductor track in a second metallization plane;
    a first source/drain terminal of each memory transistor of a third column adjacent to the second column coupled to an electrically conductive conductor track in the first metallization plane; and
    a first source/drain terminal of each memory transistor of a fourth column adjacent to the third column coupled to an electrically conductive conductor track in the second metallization plane,
    wherein the second metallization plane is different than the first metallization plane, wherein a second source/drain terminal of each memory transistor is connected to a respective electrically conductive conductor track in a third metallization plane, the third metallization plane being different than the first metallization plane and different than the second metallization plane.

2. The memory of claim 1, wherein the memory transistors are coupled to one another in a NOR circuit.

3. The memory of claim 1, wherein the memory transistors each have an ONO charge storage layer in which the electrical charge carriers can be stored in nonvolatile fashion.

4. The memory of claim 1, wherein the memory transistors each have a floating gate charge storage layer in which the electrical charge carriers can be stored in nonvolatile fashion.

5. The memory of claim 1, wherein the memory transistors are silicon memory transistors.

6. The memory of claim 1, wherein at least one portion of the memory transistors is formed in a $6F^2$ basic area or in a $4F^2$ basic area.

7. The memory of claim 1, wherein the second metallization plane is arranged above the first metallization plane.

8. The memory of claim 7, wherein the second metallization plane is the metallization plane arranged directly above the first metallization plane.

9. The memory of claim 1, wherein the third metallization plane is arranged above the second metallization plane.

10. The memory of claim 9, wherein the third metallization plane is the metallization plane arranged directly above the second metallization plane.

11. The memory of claim 1, wherein the fourth metallization plane is arranged above the third metallization plane.

12. The memory of claim 11, wherein the fourth metallization plane is the metallization plane arranged directly above the third metallization plane.

13. The memory of claim 1, wherein the first metallization plane is a metallization plane 1 of the nonvolatile memory cell arrangement, and the second metallization plane is a metallization plane 2 of the nonvolatile memory cell arrangement.

14. The memory of claim 1, wherein the third metallization plane is a metallization plane 3 of the nonvolatile memory cell arrangement.

15. The memory of claim 1, wherein the fourth metallization plane is a metallization plane 4 of the nonvolatile memory cell arrangement.

16. The memory of claim 1, wherein the memory transistors are fin field effect transistors.

17. The memory of claim 16, the memory transistors are bulk fin field effect transistors.

18. A nonvolatile memory cell arrangement, comprising:
    a multiplicity of nonvolatile memory cells, each nonvolatile memory cell being formed by a memory transistor configured so that electrical charge carriers are stored in nonvolatile fashion, and wherein the memory transistors are arranged in a matrix having a plurality of rows and columns;

a first source/drain terminal of each memory transistor of a first column coupled to an electrically conductive conductor track in a first metallization plane;

a first source/drain terminal of each memory transistor of a second column adjacent to the first column coupled to an electrically conductive conductor track in a second metallization plane;

a first source/drain terminal of each memory transistor of a third column adjacent to the second column coupled to an electrically conductive conductor track in the first metallization plane; and a first source/drain terminal of each memory transistor of a fourth column adjacent to the third column coupled to an electrically conductive conductor track in the second metallization plane, wherein the first and second metallization planes are not the same, wherein the conductor tracks are arranged in the column direction alongside the source/drain terminals and have, alongside a portion of the source/drain terminals of the memory transistors of a column, a projection extending perpendicularly to the column direction as far as above the respective source/drain terminal, and wherein the conductor tracks are coupled to the respective source/drain terminal by means of a respective projection and by means of a contact hole respectively provided below the latter.

19. A memory comprising:

a plurality of memory cell transistors arranged in a matrix having a plurality of rows and columns;

a first source/drain terminal of each memory transistor of a first column coupled to an electrically conductive conductor track in a first metallization plane;

a first source/drain terminal of each memory transistor of a second column adjacent to the first column coupled to an electrically conductive conductor track in a second metallization plane;

a first source/drain terminal of each memory transistor of a third column adjacent to the second column coupled to an electrically conductive conductor track in the first metallization plane; and a first source/drain terminal of each memory transistor of a fourth column adjacent to the third column coupled to an electrically conductive conductor track in the second metallization plane, the second metallization plane being different than the first metallization plane, wherein second source/drain terminal of each memory transistor is connected to a respective electrically conductive conductor track in a third metallization plane, the third metallization plane being different than the first metallization plane and different than the second metallization plane.

* * * * *